(12) United States Patent
Long et al.

(10) Patent No.: US 12,289,923 B2
(45) Date of Patent: Apr. 29, 2025

(54) DISPLAY PANELS AND ELECTRONIC DEVICES

(71) Applicants: Chengdu BOE Optoelectronics Technology Co., Ltd., Sichuan (CN); BOE Technology Group Co., Ltd., Beijing (CN)

(72) Inventors: Yue Long, Beijing (CN); Yongkang Zhang, Beijing (CN); Zhenli Zhou, Beijing (CN); Weiyun Huang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 302 days.

(21) Appl. No.: 17/771,728

(22) PCT Filed: Mar. 19, 2021

(86) PCT No.: PCT/CN2021/081874
§ 371 (c)(1),
(2) Date: Apr. 25, 2022

(87) PCT Pub. No.: WO2021/218483
PCT Pub. Date: Nov. 4, 2021

(65) Prior Publication Data
US 2023/0046172 A1 Feb. 16, 2023

(30) Foreign Application Priority Data
Apr. 27, 2020 (CN) .......................... 202010344334.6

(51) Int. Cl.
*H10K 59/121* (2023.01)
*H10F 39/00* (2025.01)
*H10K 50/822* (2023.01)

(52) U.S. Cl.
CPC ......... *H10F 39/802* (2025.01); *H10K 50/822* (2023.02); *H10K 59/121* (2023.02)

(58) Field of Classification Search
CPC ................ H10K 50/822; H10K 59/121; H01L 27/14603
See application file for complete search history.

(56) References Cited

U.S. PATENT DOCUMENTS

| | | | |
|---|---|---|---|
| 2020/0075680 A1 | 3/2020 | Sun et al. | |
| 2020/0135972 A1 | 4/2020 | Ma et al. | |

(Continued)

FOREIGN PATENT DOCUMENTS

| | | | | |
|---|---|---|---|---|
| CN | 108257514 A | * | 7/2018 | ............. G09F 9/302 |
| CN | 109192759 A | | 1/2019 | |

(Continued)

OTHER PUBLICATIONS

PCT/CN2021/081874 international search report.

(Continued)

*Primary Examiner* — Fatima N Farokhrooz
(74) *Attorney, Agent, or Firm* — IPro, PLLC

(57) ABSTRACT

A display panel (10) and an electronic device are provided. The display panel (10) includes a base substrate, a low-display-density region (200), a transition region (300) and a high-display-density region (400), the low-display-density region (200), the transition region (300) and the high-display-density region (400) being located on the base substrate. The transition region (300) is located between the low-display-density region (200) and the high-display-density region (400). The low-display-density region (200), the transition region (300) and the high-display-density region (400) are provided with pixel units (101) for emitting light, respectively. A display density of the low-display-density region (200) is less than a display density of the transition (Continued)

region (300), and the display density of the transition region (300) is less than a display density of the high-display-density region (400). Therefore, a clear border between the high-display-density region (400) and the low-display-density region (200) is avoided, and a display effect of the display panel (10) and the electronic device is ensured.

16 Claims, 7 Drawing Sheets

(56) References Cited

U.S. PATENT DOCUMENTS

| | | | | |
|---|---|---|---|---|
| 2020/0204715 | A1* | 6/2020 | Ouyang | H10K 59/121 |
| 2020/0312832 | A1 | 10/2020 | Chi et al. | |
| 2020/0380917 | A1 | 12/2020 | Zhu et al. | |
| 2021/0013277 | A1 | 1/2021 | Liu et al. | |
| 2021/0056913 | A1* | 2/2021 | Ko | G09G 3/3208 |
| 2021/0066409 | A1* | 3/2021 | Fan | H10K 59/121 |
| 2021/0210510 | A1* | 7/2021 | Hsieh | H01L 27/124 |
| 2021/0225265 | A1* | 7/2021 | Hong | G09G 3/32 |
| 2021/0358379 | A1 | 11/2021 | Li et al. | |
| 2022/0069023 | A1 | 3/2022 | Lou et al. | |

FOREIGN PATENT DOCUMENTS

| | | |
|---|---|---|
| CN | 109962092 A | 7/2019 |
| CN | 209070895 U | 7/2019 |
| CN | 110504289 A | 11/2019 |
| CN | 110518037 A | 11/2019 |
| CN | 110619813 A | 12/2019 |
| CN | 110767099 A | 2/2020 |
| CN | 110767694 A | 2/2020 |
| CN | 110783384 A | 2/2020 |
| CN | 110874990 A | 3/2020 |
| CN | 111028692 A | 4/2020 |
| CN | 111402740 A | 7/2020 |
| JP | 2003162236 A | 6/2003 |

OTHER PUBLICATIONS

PCT/CN2021/081874 Written Opinion.
CN2020103443346 first office action.
CN2020103443346 second office action.

* cited by examiner

DISPLAY PANELS AND ELECTRONIC DEVICES

CROSS-REFERENCE TO RELATED APPLICATIONS

This application is the U.S. national phase of PCT Application No. PCT/CN2021/081874 filed on Mar. 19, 2021, which claims priority to Chinese Patent Application No. 202010344334.6 filed on Apr. 27, 2020 and entitled "DISPLAY PANELS AND ELECTRONIC DEVICES", which is incorporated herein by reference in its entirety.

TECHNICAL FIELD

The present disclosure relates to the field of display, and in particular to a display panel and an electronic device.

BACKGROUND

With continuous improvement of science and technology, people have higher and higher requirements for a high screen-to-body ratio of devices. The most critical factor affecting the screen-to-body ratio is a front operating apparatus, such as a front camera and a front sensor. Some designs adopt an electric lifting front camera and some adopt a push-pull slide-type body. However, these designs may bring about problems such as increased failure rate, increased thickness and weight of the body, and ease of dust accumulation. In other designs, the above-mentioned operating apparatus is disposed under a screen, and the screen-to-body ratio is increased by reducing an opening of the screen.

SUMMARY

The present disclosure provides a display panel and an electronic device, which can ensure a high-quality display effect of the display panel while ensuring a normal operation of an operating apparatus.

According to a first aspect of the present disclosure, there is provided a display panel, including a base substrate, a low-display-density region, a transition region and a high-display-density region, where the low-display-density region, the transition region and the high-display-density region are located on the base substrate.

The transition region is located between the low-display-density region and the high-display-density region.

The low-display-density region, the transition region, and the high-display-density region are provided with a plurality of pixel units for display, respectively; and a display density of the low-display-density region is less than a display density of the transition region, and the display density of the transition region is less than a display density of the high-display-density region.

According to a second aspect of the present disclosure, there is provided an electronic device, including an operating apparatus and the above display panel. The operating apparatus is provided at a side of the display panel, and a projection of the operating apparatus on the base substrate is located within a projection of the low-display-density region on the base substrate.

DETAILED DESCRIPTION OF THE EMBODIMENTS

Figure 1:
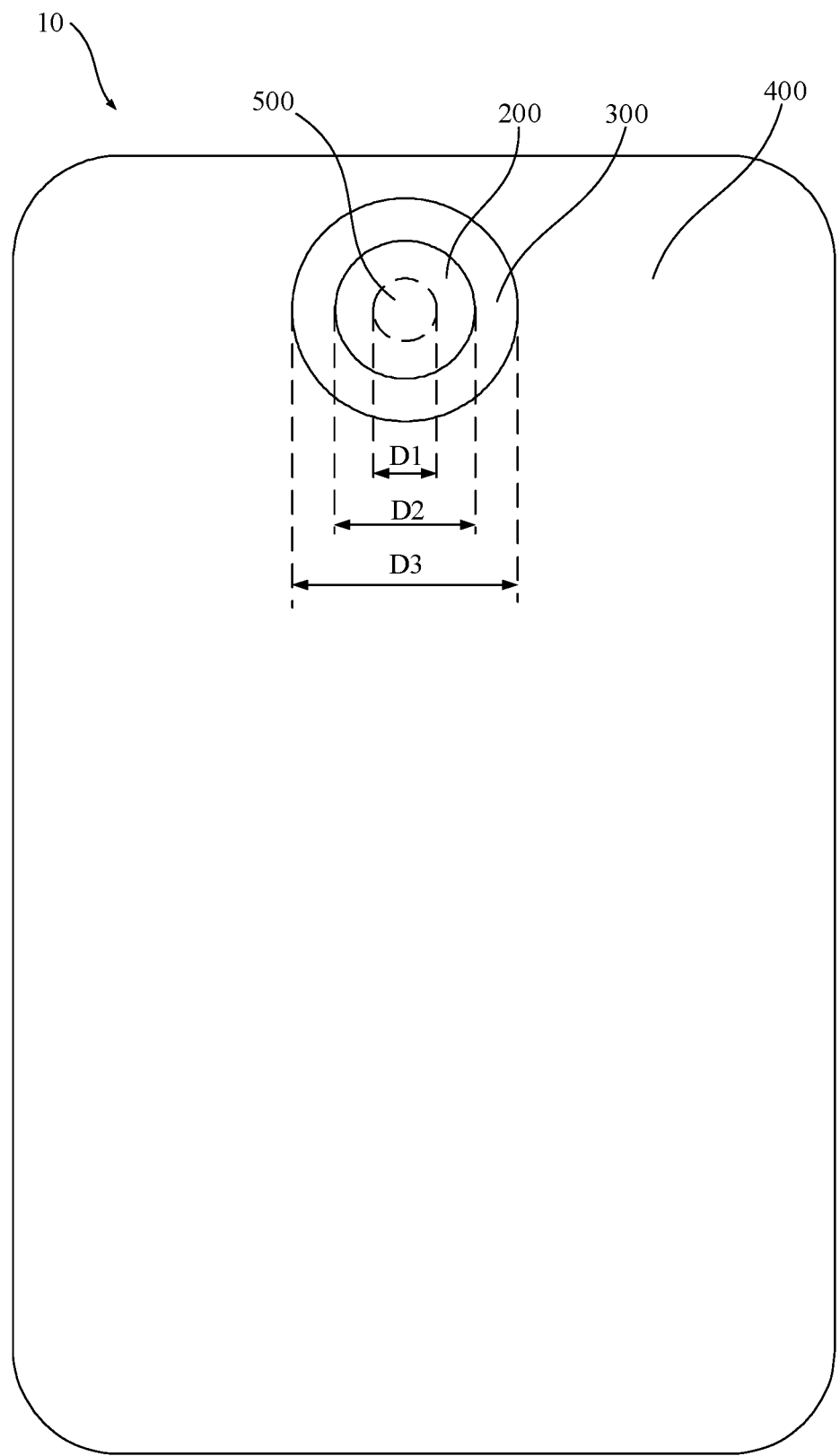
FIG. 1 is a schematic diagram illustrating a plane structure of a display panel according to an embodiment of the present disclosure.

Exemplary embodiments will be described herein in detail, examples of which are illustrated in the drawings. When the following description involves the drawings, like numerals in different drawings refer to like or similar elements unless otherwise indicated. Embodiments described in the following exemplary embodiments do not represent all embodiments consistent with the present disclosure. Rather, they are merely examples of apparatuses and methods consistent with some aspects of the present disclosure as detailed in the appended claims.

The terms used in the present disclosure are for the purpose of describing particular embodiments only, and are not intended to limit the present disclosure. As used in the present disclosure and the appended claims, terms determined by "a", "the" and "said" in their singular forms are intended to include plurality as well, unless clearly indicated otherwise in the context. It is also to be understood that the term "and/or" as used herein refers to and includes any or all possible combinations of one or more of the associated listed items.

It should be understood that words "first", "second", and the like, as used in the specification and claims of the present disclosure do not indicate any sequence, quantity or importance, but are only used to distinguish between different components. Likewise, words "a" or "an" and the like do not indicate any quantity limitation, but rather indicate the presence of at least one. Unless otherwise indicated, words such as "front", "rear", "lower" and/or "upper" are for illustrative purposes only, and are not limited to a position or a spatial orientation. Words "include" or "comprise" and the like are intended to refer to that an element or object appearing before "include" or "comprise" covers an element or object listed after "include" or "comprise" and its equivalents, and do not exclude other elements or objects. Words "connect" or "couple" and the like are not limited to a physical or mechanical connection, but may include an electrical connection, whether direct or indirect.

Embodiments of the present disclosure will be described in detail below in conjunction with the accompanying drawings. Features in the embodiments described below may be combined with each other without conflict.

In the related art, the amount of light entering into a screen is a key factor affecting a photographing quality of a subscreen camera. To ensure the photographing quality of the subscreen camera, the number of pixels near the subscreen camera may be reduced so as to lessen blocking of external light by the pixels. Since the pixels are densely distributed in a normal display region of the screen and sparsely distributed in a region of the screen where the camera is provided, a sudden change occurs between the two regions. A difference in display, for example, non-uniform display color, blurred display image, and the like, may inevitably occur at a border position (e.g., a position of a boundary between the two regions), affecting an overall display effect.

The present disclosure provides an electronic device. The electronic device includes a display panel for display. In an embodiment, the electronic device may be a mobile phone. However, in other embodiments, the electronic device may be another device with a display panel, such as a computer, a tablet, an electronic book, and a watch with a smart display function. In addition, in an embodiment, the display panel may be a flexible display panel. However, in other embodiments, the display panel may be a non-deformable display panel.

The electronic device further includes a front operating apparatus. The operating apparatus may be disposed at a side of the electronic device where the display panel is provided. The operating apparatus includes at least one of: a camera, a sensor or a receiver. In this embodiment, the operating apparatus includes a camera. The term "front" herein does not require that a portion of the operating apparatus has to be physically mounted or exposed at a side of the display panel closer to a user. The operating apparatus may be understood as a "front operating apparatus" as long as it is disposed on the electronic device and its use depends on the side of the display panel closer to the user.

Figure 3:
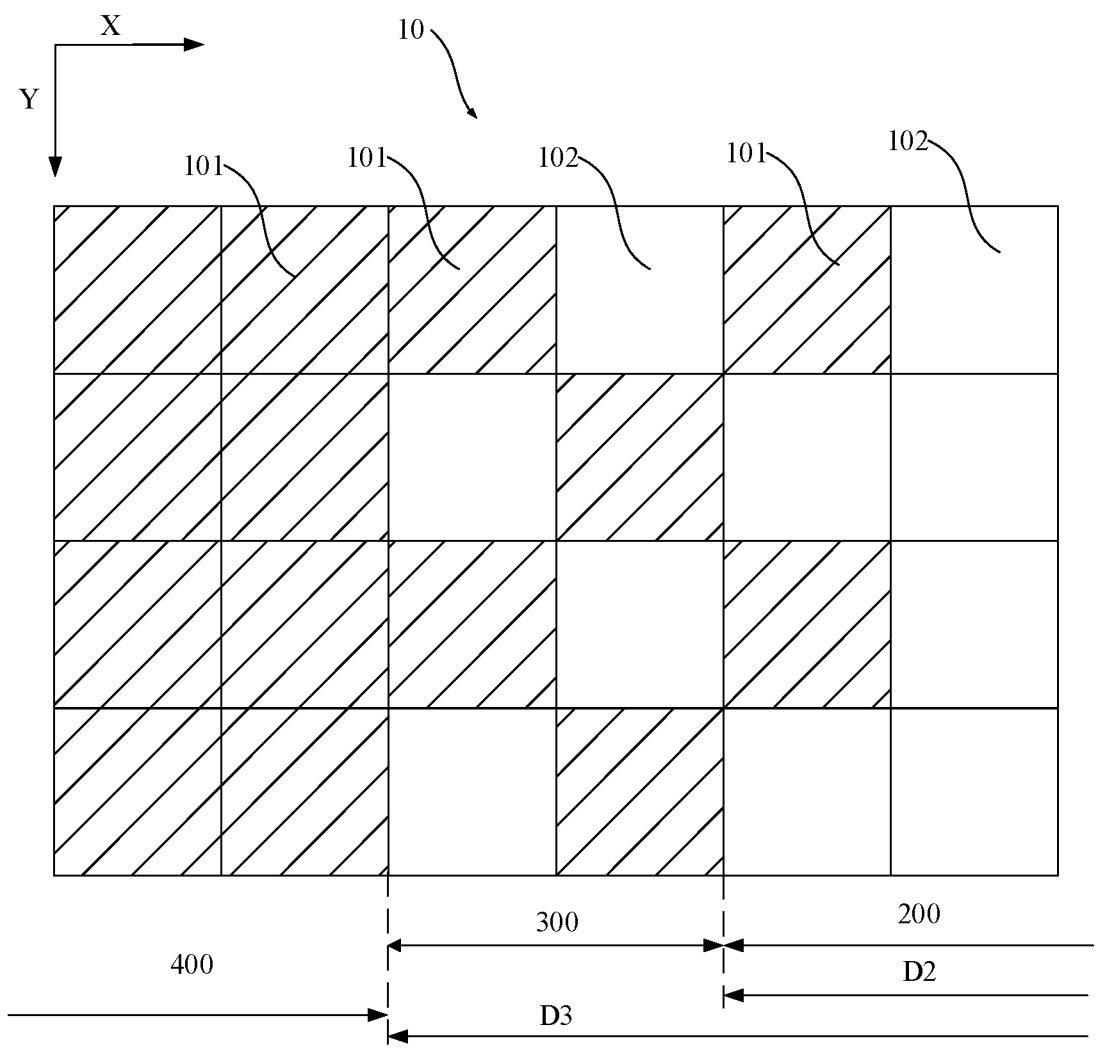
FIG. 3 is a schematic diagram illustrating a partial structure of a display panel according to an embodiment of the present disclosure.

As shown in FIG. 1, and in conjunction with FIG. 3 if necessary, a display panel 10 includes a base substrate, a low-display-density region 200, a transition region 300 and a high-display-density region 400, where the low-display-density region 200, the transition region 300 and the high-display-density region 400 are located on the base substrate. The low-display-density region 200, the transition region 300, and the high-display-density region 400 are provided with pixel units 101, respectively. A plurality of pixel units 101 may cooperate to emit light to realize a smart display of the display panel 10. It should be noted that in this embodiment, the pixel units 101 in the low-display-density region 200, the transition region 300 and the high-display-density region 400 are the same in shape and size. However, in other embodiments, the pixel units 101 in the low-display-density region 200, the transition region 300 and the high-display-density region 400 may be different in size. For example, a size of the pixel unit 101 in the low-display-density region 200 may be significantly greater than that of the pixel unit 101 in the high-display-density region 400. It should be noted that, "the pixel units 101 are the same in dimension or size" herein does not require that sizes (for example, areas) of the pixel units 101 are exactly the same in value. Due to factors such as process accuracy, it is difficult to achieve absolutely the same in actual production. As long as design values are equal or actual values are within a deviation of +/−15%, it can be regarded as "the same in dimension or size".

The low-display-density region 200 has a relatively lower display density, that is, relatively fewer pixel units 101 are arranged in the low-display-density region 200. The term "display density" corresponds to a pixel density PPI (Pixels Per Inch), which indicates the number of pixels per inch of the display panel. Specifically, a higher value of the pixel density indicates a higher display density of the display panel. Also, a projection of the operating apparatus (e.g., a camera) on the base substrate is located within a projection of the low-display-density region 200 on the base substrate. Herein, a border of the projection of the operating apparatus on the base substrate coincides with a border of the projection of the low-display-density region on the base substrate, which may also be called "within the projection". With the above arrangement, a light-collection unit 500 in the camera may collect external light through a gap (e.g., at a blank unit 102 in FIG. 3) between adjacent pixel units 101 in the low-display-density region 200 so as to achieve photographing and video recording functions. The transition region 300 is located between the low-display-density region 200 and the high-display-density region 400.

In this embodiment, as shown in FIG. 1, the transition region 300 surrounds the low-display-density region 200. The high-display-density region 400 is disposed at a side of the transition region 300 away from the low-display-density region 200, and the high-display-density region 400 surrounds the transition region 300. The low-display-density region 200 is circular, and correspondingly, the transition region 300 is regularly or irregularly ring-shaped. However, in other embodiments, the low-display-density region 200 and the transition region 300 may have other shapes; for example, the low-display-density region 200 may be square, triangular or otherwise irregularly shaped.

Figure 2:
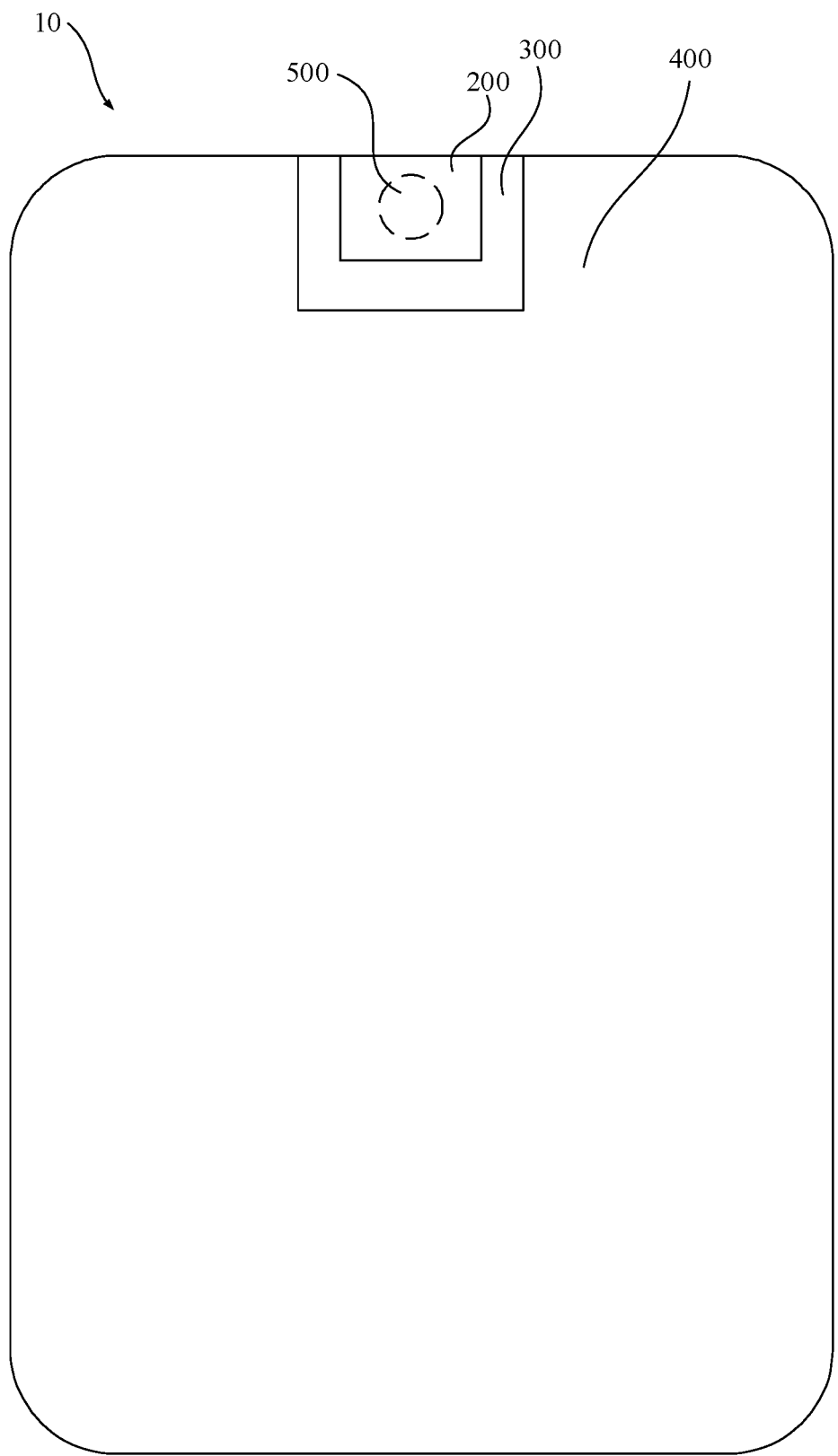
FIG. 2 is a schematic diagram illustrating a plane structure of a display panel according to another embodiment of the present disclosure.

Alternatively, the transition region 300 may not completely surround the low-display-density region 200. As shown in FIG. 2, the low-display-density region 200 may be disposed on the top of the display panel. For example, a side edge of the low-display-density region is flush with a top side of the display panel. In this case, portions of the low-display-density region 200 other than the side edge are surrounded by the transition region 300. It should be noted that a ratio of an area occupied by the pixel units 101 per unit area to the unit area is used as the display density. The larger the area occupied by the pixel units 101 per unit area, the higher the corresponding display density. In this case, a display density of the low-display-density region 200 is less than a display density of the transition region 300, and the display density of the transition region 300 is less than a display density of the high-display-density region 400. In this embodiment, the pixel units 101 are the same in size, and in this case, a higher display density indicates a larger number of pixel units 101 per unit area; whereas a lower display density indicates a smaller number of pixel units 101 per unit area.

In the above arrangement, the low-display-density region 200 is provided in the display panel 10, and the low-display-density region 200 has a relatively lower display density, that is, relatively fewer pixel units 101 are arranged in the low-display-density region 200. The operating apparatus such as a camera may be disposed at a side of the low-display-density region 200, namely, disposed below the low-display-density region 200. In this way, no additional moving device (e.g., electric lifting device, push-pull slide device, and the like) may be provided. When the electronic device performs photographing and video recording functions using the camera, the camera may operate by directly using light coming through the gap between adjacent pixel units 101 in the low-display-density region 200 rather than operate after going away from the display panel 10 by means of lifting or slide, thus lowering the failure rate and reducing the thickness of the display panel 10. Further, since the display density of the low-display-density region 200 is lower, the normal operation of the operating apparatus may not be affected, and especially, light collection of the light-collection unit 500 in the camera may not be affected. Moreover, the display density of the transition region 300 is between the display densities of the high-display-density region 400 and the low-display-density region 200, thereby achieving smooth transition of the display densities between the high-display-density region 400 and the low-display-density region 200. In this way, problems such as non-uniform display color, and blurred display image resulting from a clear border between the high-display-density region 400 and the low-display-density region 200 may be avoided, thereby ensuring a high-quality display effect of the display panel 10 and the electronic device.

Further, as shown in FIG. 1 in conjunction with FIG. 3, the display density of the transition region 300 gradually decreases along a direction from the high-display-density region 400 towards a center of the low-display-density region 200. In the above arrangement, the pixel unit 101 has a metal structure therein which can reflect the external light entering into the display panel 10. Therefore, to ensure a sufficient amount of incoming light required by the camera, that is, to improve the photographing quality of the camera, the number of the pixel units 101 in the display panel 10 near the camera may be minimized. In other words, the number of the pixel units per unit area in the low-display-density region 200 may be reduced to reduce the display density of the low-display-density region 200, such that the pixel units 101 are sparsely distributed in the low-display-density region 200.

Furthermore, to improve the display effect and optimize a full-screen effect, the display density of the low-display-density region 200 may be limited. In this embodiment, the display density of the low-display-density region 200 is equal to or greater than 0.05, and/or less than or equal to 0.4. By limiting the maximum value of the display density of the low-display-density region 200, the problem of low light transmittance of the low-display-density region 200 due to an excessively large number of pixel units 101 per unit area may be avoided. In this way, it is ensured that the light-collection unit 500 of the camera may obtain a sufficient amount of incoming light so as to ensure its normal photographing and video recording functions. By limiting the minimum value of the display density of the low-display-density region 200, the phenomenon of black stripes appearing at least partially in the low-display-density region 200 during normal display of the display panel 10 due to an excessively small number of pixel units 101 per unit area may be avoided. In this way, the normal display of the display panel 10 can be ensured and the full-screen effect viewed by naked eyes can be better achieved. However, in other embodiments, the display density of the low-display-density region 200 may be any value less than or equal to 0.4. Nevertheless, to ensure the display effect of the display panel 10, the display density of the high-display-density region 400 is relatively higher and the display density of the low-display-density region 200 is relatively lower. The display densities of the high-display-density region 400 and the low-display-density region 200 differ significantly from each other. To avoid a clear border between the high-display-density region 400 and the transition region 300, and to avoid a clear border between the transition region 300 and the low-display-density region 200, the display density of the transition region 300 may be designed to gradually decrease along a direction from the high-display-density region 400 towards the low-display-density region 200. In this way, a border between the high-display-density region 400 and the low-display-density region 200 may be further avoided, further improving the display effect of the display panel 10 and the electronic device. At the same time, setting of the lower display density in the low-display-density region 200 can be satisfied and the normal operation of the camera can be ensured.

Furthermore, the maximum border 201 of the low-display-density region 200 has a first dimension D2, which is equal to or greater than 2 mm and less than or equal to 4 mm. It should be noted that in this embodiment, the low-display-density region 200 is circular in shape, and thus a shape of the maximum border 201 is a circle, and the dimension of the maximum border 201 is a diameter of the circle. However, the shape of the low-display-density region 200 is not limited to a circle, and the shape of the maximum border 201 is not limited to a circle. For example, when the shape of the maximum border 201 of the low-display-density region 200 is a square, the maximum border 201 is a length or width of the square. When the shape of the maximum border 201 of the low-display-density region 200 is irregular, the dimension of the maximum border 201 refers to the maximum value of a length of a line connecting any two points on the maximum border 201, namely, the first dimension D2 is the maximum value of a length of a line connecting any two points on the maximum border 201 (refer to FIG. 7 for illustration).

The light-collection unit 500 is disposed at a side of the low-display-density region 200, that is, the light-collection unit 500 is disposed below the low-display-density region 200. The maximum border of the light-collection unit 500 has a fourth dimension D1, and a ratio of the first dimension D2 to the fourth dimension D1 is equal to or greater than 0.6, and less than or equal to 1.5. To improve the photographing and video recording functions of the camera, a light transmittance of a region in the display panel 10 near the camera may be increased, so as to ensure a sufficient amount of incoming light. By limiting the size of the low-display-density region 200 having a lower display density, it is ensured that the region in the display panel 10 near the camera has a high light transmittance, thereby improving the photographing and video recording functions of the camera. Likewise, in this embodiment, the dimension of the maximum border of the light-collection unit 500 is a diameter of the outermost circle. The dimension of the maximum border of the light-collection unit 500 may also be understood as the maximum value of a length of a line connecting any two points on the maximum border.

Furthermore, the maximum value of the display density of the transition region 300 is greater than 0.1 and less than 1. In this way, the transition region 300 can better connect the low-display-density region 200 and the high-display-density region 400. At the same time, the light transmittance of the region near the light-collection unit 500 of the camera can be ensured as much as possible, thus improving the photographing and video recording functions of the camera.

Figure 6:
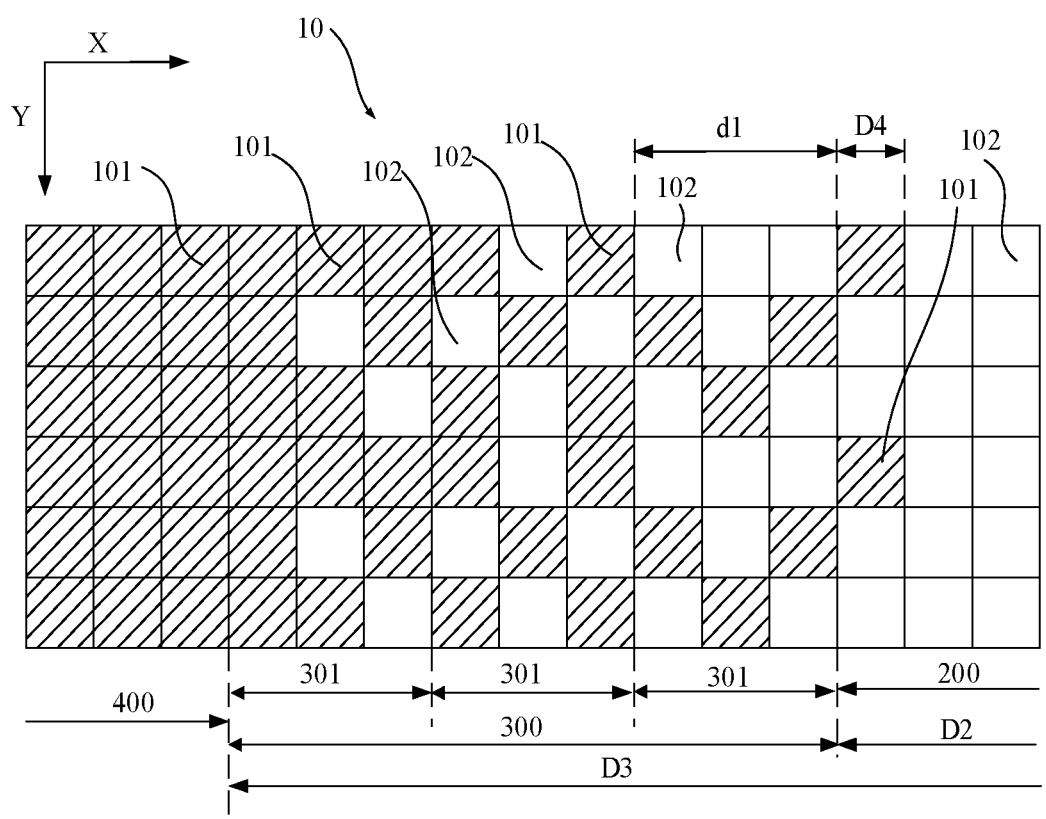
FIG. 6 is a schematic diagram illustrating a partial structure of a display panel according to still another embodiment of the present disclosure.
Figure 7:
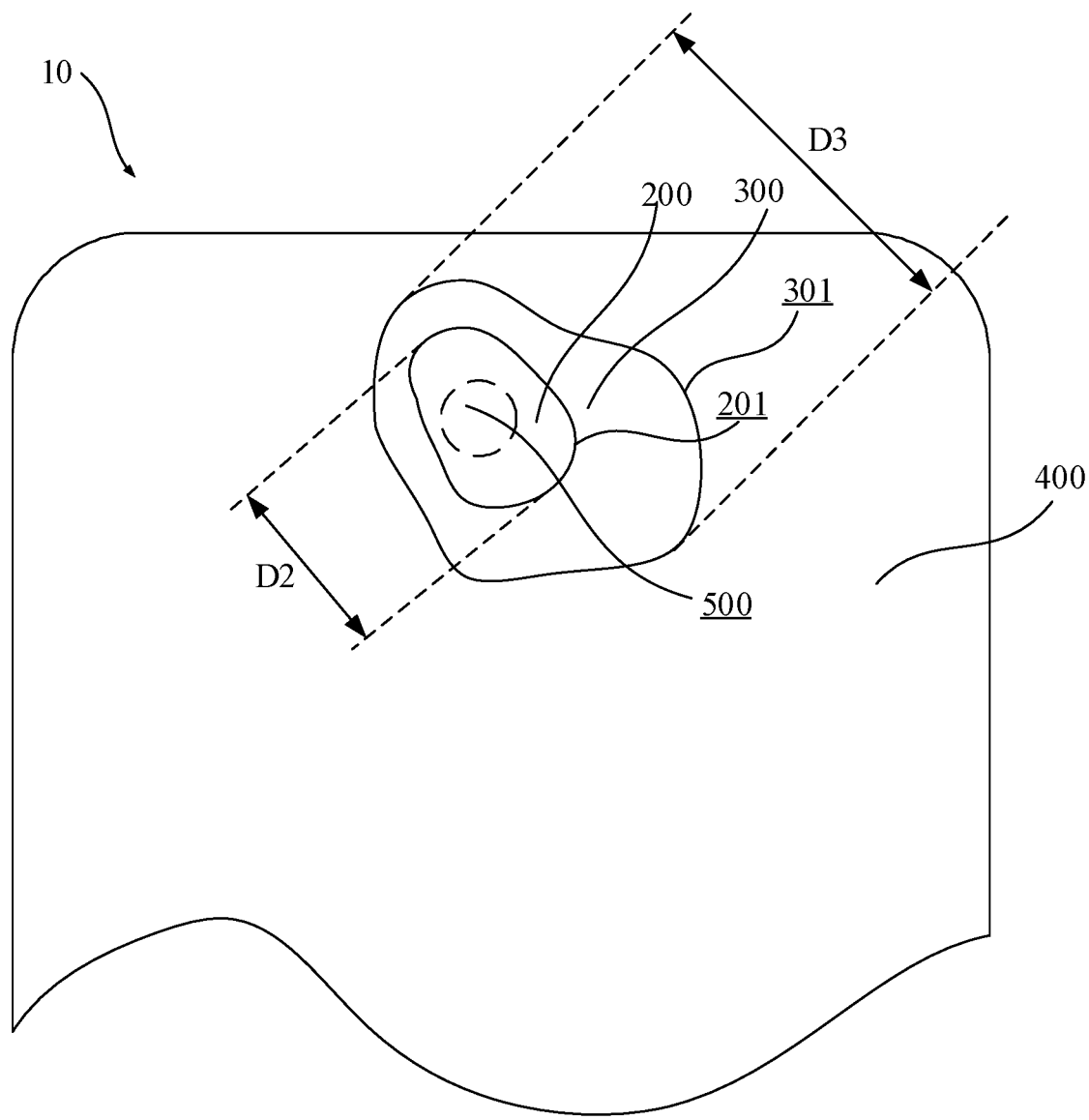
FIG. 7 is a schematic diagram illustrating a plane structure of a display panel according to yet another embodiment of the present disclosure.

Further, as shown in FIGS. 1, 6, and 7, the maximum border 301 of the transition region 300 has a second dimension D3, and a ratio of the second dimension D3 to the first dimension D2 is equal to or greater than 1.04. By limiting the size of the transition region 300, there is sufficient space available in the transition region 300 to achieve a smooth transition of display densities. Likewise, in this embodiment, the dimension of the maximum border 301 of the transition region 300 is a diameter of the outermost circle. The dimension of the maximum border 301 of the transition region 300 may also be understood as the maximum value of a length of a line connecting any two points on the maximum border 301.

Figure 4:
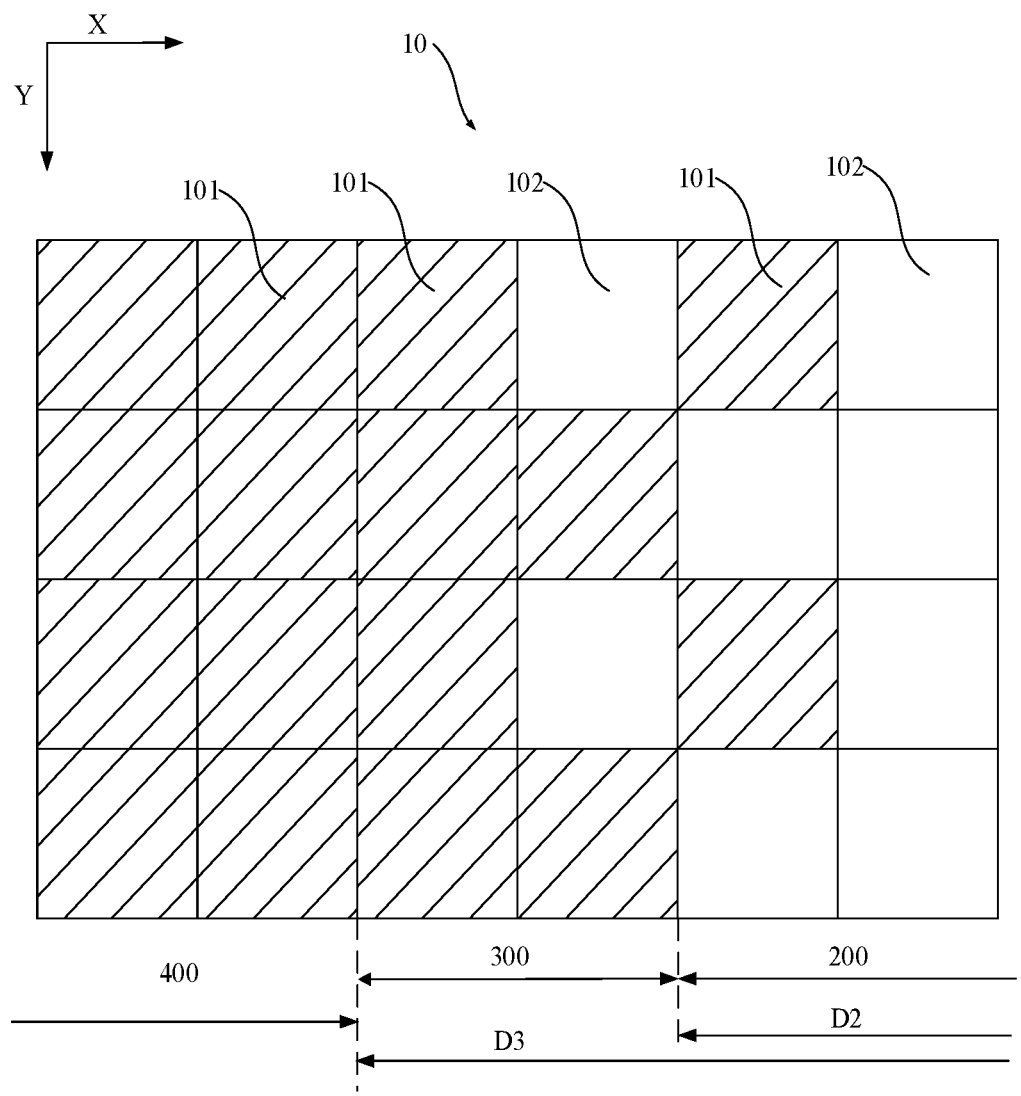
FIG. 4 is a schematic diagram illustrating a partial structure of a display panel according to another embodiment of the present disclosure.

When the display densities of the low-display-density region 200 and the high-display-density region 400 have fixed values, as shown in FIGS. 3 and 4, the smaller an area of the transition region 300 is, that is, the smaller the ratio of the second dimension D3 to the first dimension D2 is, the faster the display density changes along a direction from the high-display-density region 400 towards the low-display-density region 200. Otherwise, as shown in FIG. 5, the larger the area of the transition region 300 is, that is, the greater the ratio of the second dimension D3 to the first dimension D2 is, the slower the display density of the transition region 300 changes.

The size of the transition region 300 further depends on the display density of the low-display-density region 200. As shown in FIG. 6, when the display density of the low-display-density region 200 is lower, that is, when the area occupied by the pixel units 101 per unit area is smaller, the size of the transition region 300 may be made larger to ensure a smooth transition of display densities. Otherwise, as shown in FIGS. 3-5, when the display density of the low-display-density region 200 is higher, that is, when the area occupied by the pixel units 101 per unit area is larger, the size of the transition region 300 may be made smaller.

Furthermore, as shown in FIGS. 3-6, a plurality of pixel units 101 are provided, and the plurality of pixel units 101 are arranged in a row direction X or a column direction Y. In this embodiment, the low-display-density region 200, the transition region 300, and the high-display-density region 400 may be respectively divided into a plurality of grids arranged in the row direction X and the column direction Y. The grids involve the pixel units 101 with light-emitting elements and blank units 102 without light-emitting elements. The blank units 102 and the pixel units 101 are distributed in a grid. In the above arrangement, the pixel units 101 are arranged in the row direction X or the column direction Y to facilitate arrangement of data lines connected with the pixel units. Oblique lines in FIGS. 3-6 do not indicate section lines, but are only used to distinguish the pixel units from the blank units. The grids filled with the oblique lines indicate the pixel units 101, and the grids unfilled with the oblique lines indicate the blank units 102.

Figure 5:
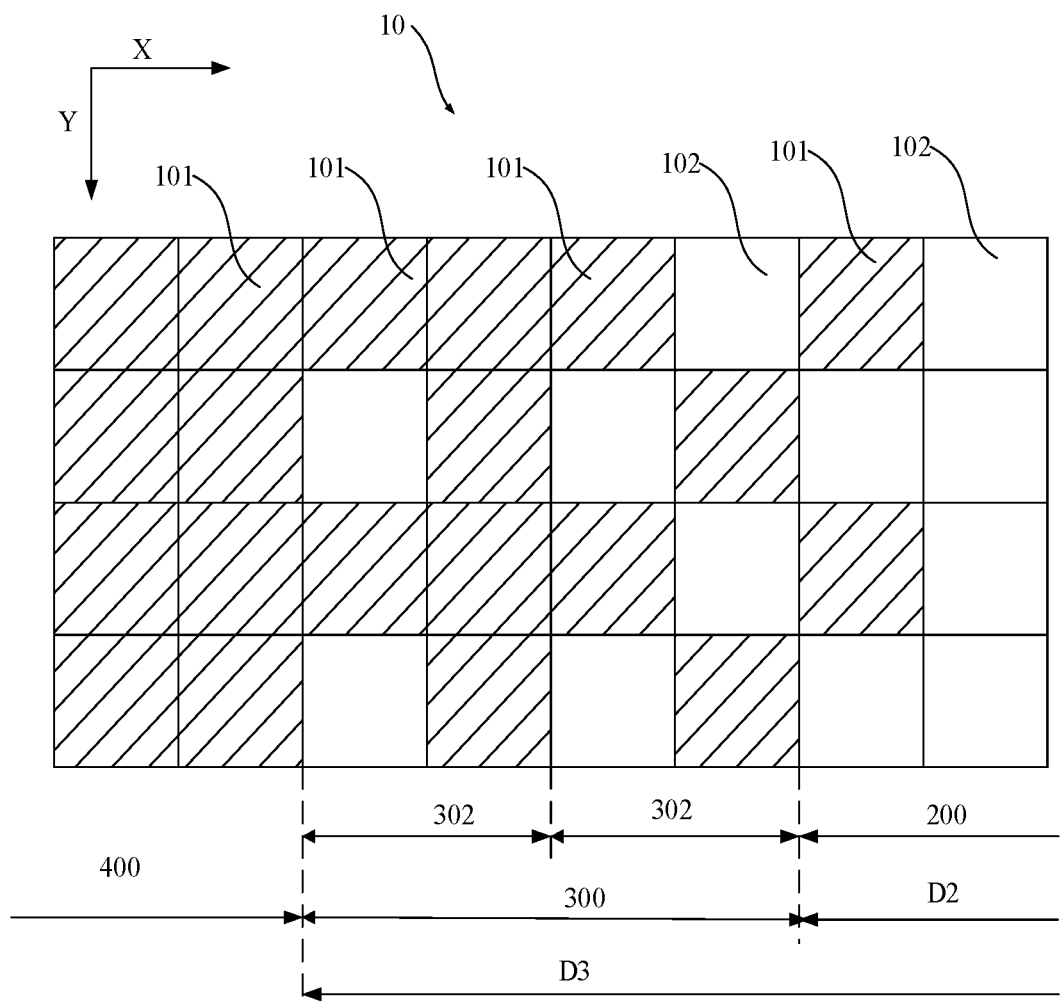
FIG. 5 is a schematic diagram illustrating a partial structure of a display panel according to yet another embodiment of the present disclosure.

It should be noted that, in the display panel 10 shown in FIGS. 3, 4 and 5, an area of one pixel unit 101 is used as a first area, and the unit area has a size of four first areas. In other words, four grids are included in the unit area. In the display panel 10 shown in FIG. 6, an area of one pixel unit 101 is used as a first area, and the unit area has a size of nine first areas. In other words, nine grids are included in the unit area. In this case, the transition region 300 in the display panel 10 shown in FIG. 6 includes three unit regions 302 in the row direction X, with the unit regions 302 having the same area, which is the unit area. The transition region 300 in the display panel 10 shown in FIG. 5 includes two unit regions 302 in the row direction X, with the unit regions 302 having the same area, which is the unit area.

Furthermore, as shown in FIG. 6, a distance between two adjacent pixel units 101 has a first value d1, the pixel unit 101 has a third dimension D4, and a ratio of the first value d1 to the third dimension D4 is less than or equal to 3. However, it may also be understood as the number of the blank units 102 provided between two adjacent pixel units 101 being not more than 3. In particular, the number of the blank units 102 provided between two adjacent pixel units 101 in the low-display-density region 200 and the transition region 300 is not more than 3. In the above arrangement, by limiting the ratio of the first distance value d1 to the third dimension D4, the number of the blank units 102 provided continuously may be limited. In this way, the phenomenon of black stripes appearing on the display panel 10 during normal display thereof due to large-area aggregation of regions without light-emitting elements may be avoided. With the above arrangement, the high-quality display effect of the display panel 10 and the electronic device can be ensured.

It should be noted that the blank unit 102 referred to herein may be a part which actually does not exist, and may only be understood as a region in the display panel 10 that is not provided with light-emitting elements and has the same area as the pixel unit 101, where the region, in whole or in part, may be available for light to pass through. Further, the shape of the pixel unit 101 referred to herein may be understood as a square, a circle, or the like. In this case, the third dimension is a length of the square or a diameter of the circle. However, the shape of the pixel unit 101 may also be understood as an irregular shape and in this case, the dimension of the pixel unit 101 is the maximum value of a length of a line connecting any two points on the maximum border.

Furthermore, the display densities of the transition region 300 generally tend to increase along the direction from the low-display-density region 200 towards the high-display-density region 400, with a rate of change corresponding to a rate of increase being less than 0.4. Using a distance from each position in the transition region 300 to the low-display-density region 200 (border) as an abscissa value (unit: mm), and a display density value at each position in the transition region 300 as an ordinate value, a change curve (which may be straight or non-straight) may be made, and a slope of each point on the change curve represents the rate of change in an increase amplitude of the display density at a corresponding position in the transition region. In other words, the slope of each point on the change curve is less than 0.4. By limiting the rate of change, the problem of presence of clear borders among the low-display-density region 200, the transition region 300, and the high-display-density region 400 due to an excessive rate of change (that is, too fast increase in the display density at each position in the transition region 300 along the direction from the low-display-density region 200 towards the high-display-density region 400) may be avoided. Meanwhile, the problem of presence of a clear border in the transition region 300 due to too fast increase in the display density at each position in the transition region 300 along the direction from the low-display-density region 200 towards the high-display-density region 400 may be avoided.

The above are merely preferred embodiments of the present disclosure, and do not limit the present disclosure in any form. Although the present disclosure has been disclosed as above in the preferred embodiments, the present disclosure is not limited thereto. Any person skilled in the art may utilize the technical contents disclosed above to make some variations or modifications into equivalent embodiments with equivalent changes, without departing from the scope of the technical solution of the present disclosure. Any simple variations, equivalent changes and modifications made to the above embodiments based on the technical essence of the present disclosure without departing from the contents of the technical solution of the present disclosure shall fall within the scope of the technical solution of the present disclosure.

The invention claimed is:

1. A display panel, comprising:
   a base substrate;
   a low-display-density region, located on the base substrate;
   a high-display-density region, located on the base substrate; and
   a transition region, located on the base substrate and between the low-display-density region and the high-display-density region,
   wherein the low-display-density region, the transition region, and the high-display-density region are provided with a plurality of pixel units for display, respectively; and
   a display density of the low-display-density region is less than a display density of the transition region, and the display density of the transition region is less than a display density of the high-display-density region; and
   wherein a maximum border of the low-display-density region has a first dimension, and a maximum border of the transition region has a second dimension, wherein the first dimension is the greater of the length or breadth values of the low-display-density region, and the second dimension is the greater of the length or breadth values of the transition region, a ratio of the second dimension to the first dimension is equal to or greater than 1.04, and display densities of the transition region at various positions tend to increase along a direction from the low-display-density region towards the high-display-density region, with a rate of increase of the display densities being less than 0.4, wherein the rate of increase is defined as increase of the display density (y-axis) versus the distance from the low towards the high display densities (x-axis) so as to avoid clear borders between the transition region and the low-display-density region and between the transition region and the high-display-density region, and wherein the display density is a ratio of an area occupied by the pixel units per unit area to the unit area.

2. The display panel of claim 1, wherein
   the transition region at least partially surrounds the low-display-density region; and
   the high-display-density region is disposed at a side of the transition region away from the low-display-density region, and the high-display-density region at least partially surrounds the transition region.

3. The display panel of claim 1, wherein the display density of the transition region gradually decreases along a direction from the high-display-density region towards the low-display-density region.

4. The display panel of claim 1, wherein the first dimension is equal to or greater than 2 mm and less than or equal to 4 mm.

5. The display panel of claim 1, wherein the display densities of the low-display-density region and the high-display-density region have fixed values, and the smaller the ratio of the second dimension to the first dimension is, the faster the display density of the transition region changes along a direction from the high-display-density region towards the low-display-density region.

6. The display panel of claim 1, wherein
   the display density of the low-display-density region is equal to or greater than 0.05; and/or
   the display density of the low-display-density region is less than or equal to 0.4.

7. The display panel of claim 1, wherein the plurality of pixel units are arranged in a row or column direction.

8. The display panel of claim 1, wherein the display density of the transition region has a maximum value that is greater than 0.1 and less than 1.

9. The display panel of claim 1, wherein the smaller the display density of the low-display-density region is, the larger a size of the transition region is.

10. The display panel of claim 1, wherein the plurality of pixel units in the low-display-density region, the transition region, and the high-display-density region are same in shape and/or size.

11. An electronic device, comprising:
    an operating apparatus; and
    the display panel of claim 1,
    wherein the operating apparatus is provided at a side of the display panel, and a projection of the operating apparatus on the base substrate is located within a projection of the low-display-density region on the base substrate.

12. The electronic device of claim 11, wherein a light-collection unit is disposed at a side of the low-display-density region, a maximum border of the light-collection unit has a fourth dimension, and a ratio of the first dimension to the fourth dimension is equal to or greater than 0.6 and less than or equal to 1.5.

13. The electronic device of claim 11, wherein the operating apparatus comprises at least one of a camera, a sensor, or a receiver.

14. The electronic device of claim 11, wherein
    the transition region at least partially surrounds the low-display-density region; and
    the high-display-density region is disposed at a side of the transition region away from the low-display-density region, and the high-display-density region at least partially surrounds the transition region.

15. The electronic device of claim 11, wherein the display density of the transition region gradually decreases along a direction from the high-display-density region towards the low-display-density region.

16. The electronic device of claim 11, wherein the first dimension is equal to or greater than 2 mm and less than or equal to 4 mm.

* * * * *